United States Patent [19]

Igarashi

[11] Patent Number: 4,787,853
[45] Date of Patent: Nov. 29, 1988

[54] PRINTED CIRCUIT BOARD WITH THROUGH-HOLE CONNECTION

[75] Inventor: Yutaka Igarashi, Ohme, Japan

[73] Assignee: Kabushiki Kaisha Toshiba, Kanagawa, Japan

[21] Appl. No.: 30,505

[22] Filed: Mar. 27, 1987

[30] Foreign Application Priority Data

Mar. 29, 1986 [JP] Japan ................................. 61-71431

[51] Int. Cl.[4] .............................................. H05K 1/00
[52] U.S. Cl. ...................... 439/55; 174/68.5; 361/405; 361/406; 439/876
[58] Field of Search ............... 174/68.5; 361/400, 404, 361/405, 406; 439/873, 876, 751; 430/55

[56] References Cited

U.S. PATENT DOCUMENTS

| | | | |
|---|---|---|---|
| 2,329,471 | 9/1943 | King .................................. | 439/873 X |
| 3,444,617 | 5/1969 | Stricker et al. .................... | 361/405 X |
| 4,110,904 | 9/1978 | Johnson ............................. | 174/68.5 |
| 4,258,468 | 3/1981 | Balde ................................. | 174/685 X |
| 4,274,700 | 6/1981 | Keglewitsch et al. ........... | 439/751 X |
| 4,410,230 | 10/1983 | San Miguel ..................... | 439/876 X |
| 4,552,422 | 11/1985 | Bennett et al. .................. | 361/400 X |

FOREIGN PATENT DOCUMENTS 1665015 12/1970 Fed. Rep. of Germany ..... 174/68.5

Primary Examiner—Morris H. Nimmo
Attorney, Agent, or Firm—Finnegan, Henderson, Farabow, Garrett & Dunner

[57] ABSTRACT

A printed circuit board is disclosed which comprises a plurality of non-through holes into thickness direction in one surface of the board, a plurality of through holes in some of the non-through holes to open through opposite surface of the board and having a smaller inside diameter than the non-through holes, a plurality of first conductive lands on the periphery of the openings of the non-through holes in one surface of the board, a plurality of second conductive lands on the periphery of the openings in opposite surface of the through holes and having the smaller outside diameter than the second lands on the periphery of the openings of the non-through holes, a conductor layer in inside wall of the non-through holes and the through holes for connecting the first lands in one surface and the second conductive lands in opposite surface of board, and conductive patterns formed in one surface and opposite surface of the board respectively, which invention is capable of including the great number of the conductive patterns as necessary for mounting the electric component such as PGA or HPC without multilayering the board or going around of the conductive patterns, because of the greater number of the spaces between the second lands can be formed in opposite surface.

6 Claims, 4 Drawing Sheets

PRINTED CIRCUIT BOARD WITH THROUGH-HOLE CONNECTION

The present application claims priority of Japanese patent application No. 61-71431 filed on Mar. 29, 1986.

FIELD OF THE INVENTION AND RELATED ART STATEMENT

This invention relates to a printed circuit board for mounting a device with a great number of terminal pins such as Pin Grid Arrays (referred as PGA hereinafter) and Half-Pitched Connectors (referred as HPC hereinafter).

Conventionally, for mounting the device with a great number of terminal pins such as PGA or HPC, it has been used a printed circuit board in which the holes are formed in accordance with the number of the pins.

FIG. 7 is a perspective view of a conventional PGA.

The PGA has 256 pins with 2.54 mm pin spacing.

And FIG. 8 is a perspective view of a conventional HPC.

The HPC has 60 pins in a plurality of ranks with 2.54 mm each pin spacing in a rank, and each rank has 1.27 mm spacing.

FIG. 9 is a side cross-sectional view of a conventional printed circuit board in which PGA is mounted.

Referring to FIG. 9, numeral 1 denotes a printed circuit board in which an insulating board is used as its base, numeral 2 denotes a hole formed at predermined locations, numeral 3 denotes a first land formed at one end of each hole 2 in one surface of the board 1, numeral 4 denotes a second land formed on the opposite end of the hole 2 in opposite surface of the board 1, numeral 5 denotes a conductor layer for connecting electrically the lands 3 and 4, numeral 6 denotes a PGA, numeral 7 denotes a terminal pin of PGA 6, numeral 7a denotes a stopper formed to hold the PGA 6 in a slightly raised position from the one surface of the board 1 and numeral 8 denotes a solder for connecting the terminal pin 7 with lands 3 and 4.

FIG. 10 is an enlarged top view of a part of the board 1 shown in FIG. 9.

Referring to FIG. 10, numeral 2 denotes a hole formed on the one surface of the board 1, numeral 3 denotes a land formed on the periphery of the opening of the hole 2, numeral 9 denotes a conductive pattern formed between each land 3.

FIG. 11 is an enlarged view showing part of the opposite surface of the board 1 shown in FIG. 9.

In FIG. 11, numeral 2 denotes a hole formed through the board 1 to the opposite surface, numeral 4 denotes a land 4 formed on the periphery of the opening of the hole 2, numeral 10 denotes a conductive pattern formed between each land 4.

By the way, in the conventional printed circuit board as mentioned above, the diameter of the first land 3 formed in one surface has the same diameter of the second land 4 in opposite surface. So, it results that the spaces between each land 3 and land 4 are formed to be same, and the maximum number of conductive patterns which can be formed between each land are also the same. And it is required to form the diameter of the hole 2 large enough for permitting the insertion of the terminal pin 7 of PGA 6. But is has the limitation to form the diameter smaller.

Therefore, in the example as shown in FIGS. 10 and 11, it is limited to form only two conductive patterns between each land formed in one surface and in opposite surface of the board 1.

As mentioned above, the conventional printed circuit board has disadvantages in that it has small maximum number of conductive patterns to be formed between each land in one surface and in the opposite surface, and that it is sometimes impossible to mount the required number of conductive patterns for PGA mounting in a monolayer type of printed circuit board.

Therefore, in the conventional printed circuit board, it has been taken the following countermeasures for mounting the required number of conductive patterns, that the board 1 is made in a multiple layer, or the conductive patterns are formed to go around and formed to be larger than necessary. However, these countermeasures result in the increase of manufacturing cost.

OBJECTS AND SUMMARY OF THE INVENTION

The present invention is carried out in view of these disadvantages mentioned above. And an object of the present invention is to provide a printed circuit board for mounting a device with a great number of terminal pins such as PGA and HPC, which is capable of mounting the greatly increased maximum number of conductive patterns between the lands of the board.

The printed circuit board of the present invention comprises an insulating board, a plurality of non-through holes formed into the thickness direction in one surface of the board, a plurality of through holes formed in some of the non-through holes to open through the opposite surface of the board and having a smaller inside diameter than the nonthrough holes, a plurality of first conductive lands formed on the periphery of the openings of the non-through holes in one surface of the board, a plurality of second conductive lands formed on the periphery of the openings in the opposite surface of the through holes and having the smaller outside diameter than the second lands formed on the periphery of the openings of the non-through holes, a conductor layer formed in the inside wall of the non-through holes and the through holes for connecting the first lands in one surface with the second conductive lands in the opposite surface of board, and conductive patterns formed in one surface and the opposite surface of the board respectively.

As mentioned above, the present invention is capable of forming the great number of the conductive patterns as necessary for mounting the device such as PGA or HPC without multilayering the board or going around the conductive patterns. This is because a greater number of spaces between each land can be formed in the opposite surface.

DETAILED DESCRIPTION OF PREFERRED EMBODIMENTS

Now, the preferred embodiments of the present invention will be described in detail as illustrated in the accompanying drawings.

Figure 1:
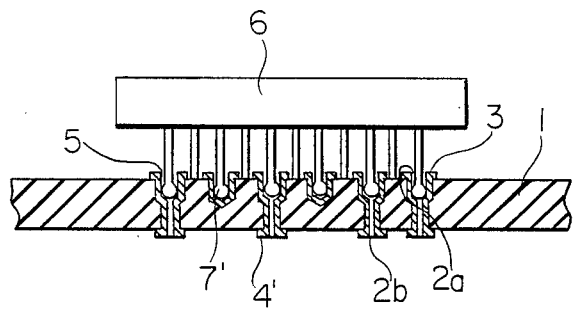
FIG. 1 is a side cross-sectional view showing one embodiment of the present invention.
Figure 9:
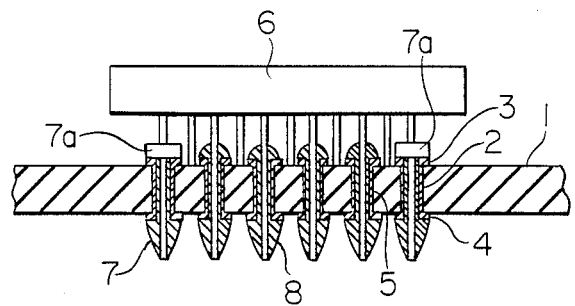
FIG. 9 is a side cross-sectional view showing a conventional printed circuit board on which the PGA is mounted.

FIG. 1 shows the structure of one embodiment of the present invention in which portions shown in FIG. 9 are referred to similar numerals.

In FIG. 1, numeral 1 denotes a printed cricuit board in which an insulating board is used as its base, numeral 2a denotes a hole formed in one surface of the board, numeral 2b denotes a hole formed to be through-connected with some of the holes 2a in the opposite surface of the board, numeral 3 denotes a first land formed in the periphery of the opening of the hole 2a, numeral 4' denotes a second land formed in the periphery of the other opening of the hole 2b, numeral 5 denotes a conductor layer for through-connecting some of the holes 2a in one surface with the holes 2b in the opposite surface, numeral 6 denotes a PGA and numeral 7' denotes a terminal pin of PGA 6.

Figure 2:
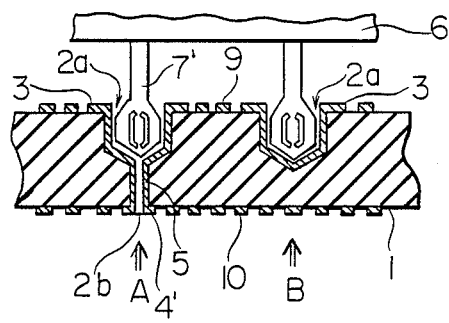
FIG. 2 is an enlarged cross-sectional view showing the important portion of FIG. 1.

FIG. 2 is an enlarged side cross-sectional view showing the important portion of FIG. 1.

As will clearly be seen in FIG. 2, the printed circuit board of this embodiment has its holes 2b in the opposite surface of the board made with a smaller diameter than the holes 2a in one surface of the board (the hole 2a has its diameter in the range 0.9 to 1.00 mm and the hole 2b has its diameter in the range of 0.1 to 0.4 mm).

Also, the diameter of the second lands 4' formed in opposite surface of the board are remarkably smaller than the first lands 3 in one surface (the first land 3 has its diameter in the range of 1.4 to 1.5 mm and the second land 4' has its diameter in the range of 0.4 to 0.5 mm).

Further, the printed circuit board of this embodiment has only some of the holes 2a in one surface of the board 1 which are formed as the holes 2b through-connecting with the opposite surface of the board, and the rest of the holes 2a not through-connecting with the opposite surface are closed at the end.

Referring to FIG. 2, character A denotes the hole opened through the opposite surface of the board 1 and B denotes the hole which is closed at the end.

In this embodiment, each terminal pin 7' is formed to have an enlarged tip and is pressure-insert fixed with the respective hole 2a.

Figure 3:
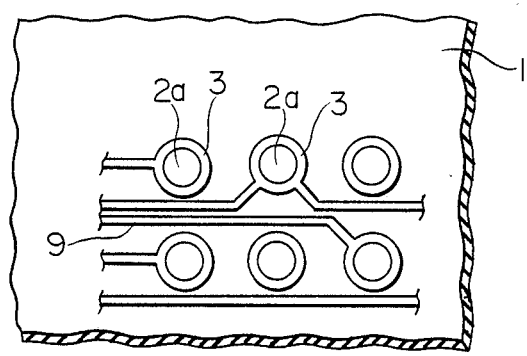
FIG. 3 is an enlarged top view showing the board in FIG. 1.

FIG. 3 is an enlarged top view showing the board 1 of the embodiment of the printed circuit board.

Figure 10:
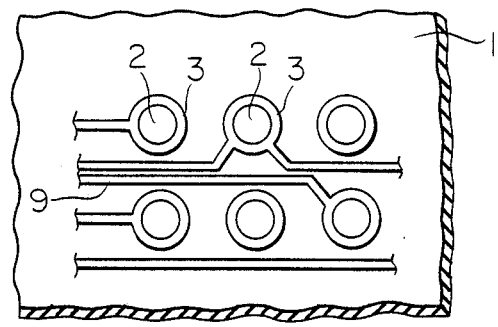
FIG. 10 is an enlarged top view of the conventional printed circuit board.
Figure 11:
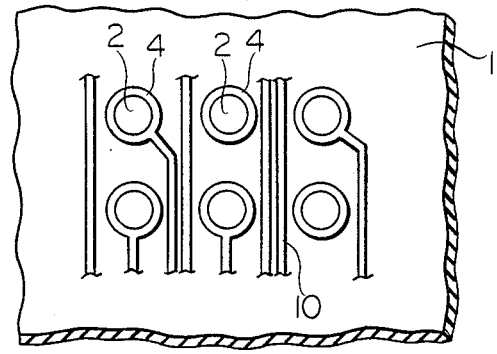
FIG. 11 is an enlarged bottom view of the conventional printed circuit board.

As shown in FIG. 3, the hole 2a has a large enough diameter for permitting the insertion of terminal pin 7' of PGA 6, and the first lands 3 formed in the periphery of the openings of the holes 2a have substantially the same size as the lands in the conventional printed circuit board as shown in FIGS. 9 through 11.

Furthermore, in one surface of the board 1, the maximum number of the conductive patterns to be formed between the first lands 3 is 2 (two) similarly to the conventional printed circuit board as shown in FIGS. 9 through 11.

Figure 4:
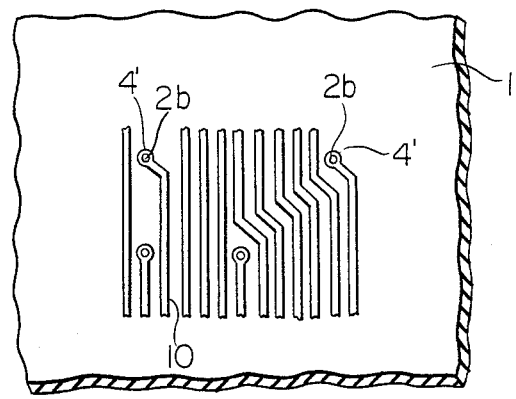
FIG. 4 is an enlarged bottom view showing the board in FIG. 1, FIGS. 5 and 6 are side cross-sectional views of the board of FIG. 1 showing how a PGA is soldered on the board.

FIG. 4 is an enlarged bottom view showing the printed circuit board of this embodiment.

As can be clearly seen in FIG. 4, the holes 2b the opposite surface of the board have a remarkably smaller diameter than the holes 2a in one surface, and also the second lands 4' formed in the periphery of the openings of holes 2b have a remarkably smaller diameter than the first lands 3 formed in one surface of the board.

Also, in the opposite surface of the board 1, the maximum number of the conductive patterns to be formed between the second lands 4' is 5 (five).

As mentioned above, in the printed circuit board of this embodiment, some of the holes 2a formed to permit the insertion of terminal pins of PGA 6 in one surface of the board 1 have a closed end where the through-hole connection is unnecessary. Since, the holes 2b and the second lands 4' in the opposite surface of the board 1 have the remarkably smaller diameter respectively as compared with the holes 2a and the first lands 3 in one surface of the board 1, it results that the number of the spaces between each second lands in the opposite surface becomes greater and also the maximum number of the conductive patterns to be formed in opposite surface is increased.

Therefore, as described above, it can be formed the printed circuit board capable of mounting a greater number of conductive patterns as necessary without multilayering the board or going around the conductive patterns.

Further, the terminal pins 7' of PGA 6 in the printed circuit board of this embodiment, are formed to have the enlarged tip and are pressure fixed with the respective holes 2a, further they may be soldered in the respective holes 2a.

Figure 5:
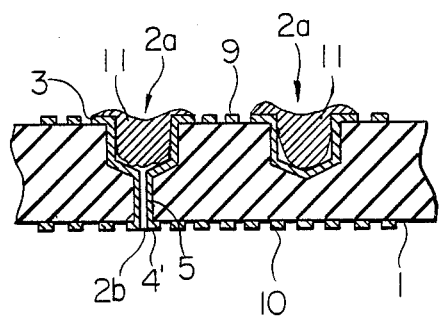
Figure 6:
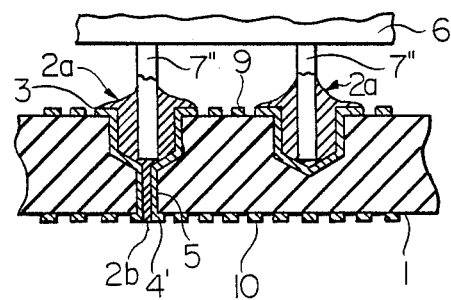
Figure 7:
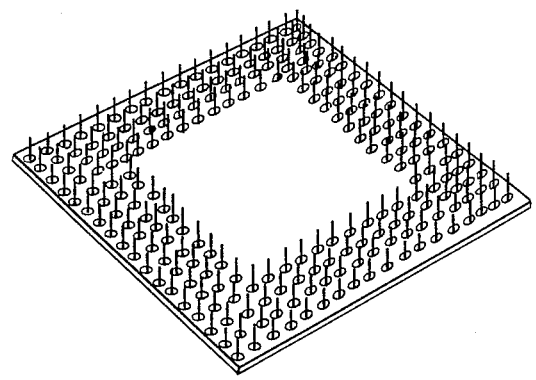
FIG. 7 is a perspective view showing an ordinary PGA.
Figure 8:
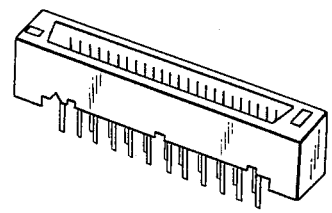
FIG. 8 is a perspective view showing an ordinary HPC.

FIGS. 5 and 6 are showing the process for soldering the terminal pins 7'' in the respective holes 2a.

As shown in FIG. 5, prior to mounting the component, it is masking the periphery of the holes 2a in one surface of the board 1 and then coating a soldering paste 11.

Further, as shown in FIG. 6, the terminal pins 7'' of the PGA 6 are inserted into the respective holes 2a and then soldering the molten solder into the holes 2b by the method such as reflow soldering.

Alternatively, the holes 2a may be printed with Ag or Cu conductive paste to adhere the PGA terminal pins 7 there. Setting of the paste causes the terminal pins to be fixed in position. This method eliminates the above method of soldering with masking and soldering paste.

Each embodiment as described above, is described for mounting the PGA for the present invention. However, the present invention is not limited to this type of component, it is also suitable for use in a wide variety of devices such as HPC in which a great number of conductive patterns are required to be formed.

The printed circuit board of the present invention comprises a plurality of non-through holes formed into the thickness direction in one surface of the board, and a plurality of through holes formed in some of the non-through holes to open through the opposite surface of the board and having a smaller inside diameter than the non-through holes. A plurality of first conductive lands are formed on the periphery of the openings of the non-through holes in one surface of the board, and a plurality of second conductive lands are formed on the periphery of the openings in the opposite surface of the through holes having a smaller outside diameter than the second lands formed on the periphery of the openings of the non-through holes. A conductor layer is formed on the inside wall of the non-through holes and the through holes for connecting the first lands in one surface and the second conductive lands in the opposite surface of the board, and conductive patterns are formed in one surface and the opposite surface of the board respectively.

So, the present invention is capable of forming the great number of the conductive patterns as necessary for mounting the device such as a PGA or HPC without multilayering the board or going around the conductive patterns. This is because a greater number of the spaces between each second lands can be formed in the opposite surface.

What is claimed is:

1. A printed circuit board having one surface and an opposite surface, comprising:
    a plurality of non-through holes formed in the thickness direction of said printed circuit board in said one surface,
    a plurality of through holes formed in selected ones of said non-through holes to open through to said opposite surface, said through holes having a smaller inside diameter than said non-through holes,
    a plurality of first conductive lands formed on the periphery of the openings of said non-through holes in said one surface,
    a plurality of second conductive lands formed on the periphery of the openings of said through holes on said opposite surface and having a smaller outside diameter than said first lands formed on the periphery of the openings of said non-through holes,
    a plurality of conductive connecting means formed on the inside wall of said non-through holes and said through holes respectively, for connecting said first conductive lands in said one surface with said second conductive lands in said opposite surface, and
    conductive patterns formed on said one surface and said opposite surface respectively.

2. The printed circuit board according to claim 1, wherein said board has a greater number of said conductive patterns between said second conductive lands in said opposite surface than between said first conductive lands in said one surface.

3. An assembly, comprising:
    a printed circuit board having one surface and an opposite surface;
    a plurality of non-through holes formed in the thickness direction of said printed circuit board in said one surface,
    a plurality of through holes formed in selected ones of said non-through holes to open through to said opposite surface, said through holes having a smaller inside diameter than said non-through holes,
    a plurality of first conductive lands formed on the periphery of the openings of said non-through holes in said one surface,
    a plurality of second conductive lands formed on the periphery of the openings of said through holes on said opposite surface and having a smaller outside diameter than said first lands formed on the periphery of the openings of said non-through holes,
    a plurality of conductive connecting means formed on the inside wall of said non-through holes and said through holes respectively, for connecting said first conductive lands in said one surface with said second conductive lands in said opposite surface,
    conductive patterns formed on said one surface and said opposite surface respectively, and
    a Pin Grid Array having a plurality of terminal pins, said terminal pins being received in selected ones of said plurality of non-through holes and through holes to mount the Pin Grid Array on said printed circuit board.

4. The assembly of claim 3 wherein said terminal pins have enlarged tips for being pressure-fitted in selected ones of said non-through and through holes.

5. An assembly, comprising:
    a printed circuit board having one surface and an opposite surface;
    a plurality of non-through holes formed in the thickness direction of said printed circuit board in said one surface,
    a plurality of through holes formed in selected ones of said non-through holes to open through to said opposite surface, said through holes having a smaller inside diameter than said non-through holes,
    a plurality of first conductive lands formed on the periphery of the openings of said non-through holes in said one surface,
    a plurality of second conductive lands formed on the periphery of the openings of said through holes on said opposite surface and having a smaller outside diameter than said first lands formed on the periphery of the openings of said non-through holes,
    a plurality of conductive connecting means formed on the inside wall of said non-through holes and said through holes respectively, for connecting said first conductive lands in said one surface with said second conductive lands in said opposite surface,
    conductive patterns formed on said one surface and said opposite surface respectively, and
    a Half Pitched Connector having a plurality of terminal pins, said terminal pins being received in selected ones of said plurality of non-through holes and through holes to mount the Half Pitched Connector on said printed circuit board.

6. The assembly of claim 5 wherein said terminal pins have enlarged tips for being pressure-fitted in selected ones of said non-through and through holes.

* * * * *